United States Patent [19]

Windischmann

[11] Patent Number: 5,792,254
[45] Date of Patent: Aug. 11, 1998

[54] PRODUCTION OF DIAMOND FILM

[75] Inventor: Henry Windischmann, Northboro, Mass.

[73] Assignee: Saint-Gobain/Norton Industrial Ceramics Corp., Worcester, Mass.

[21] Appl. No.: 662,186

[22] Filed: Jun. 12, 1996

[51] Int. Cl.$^6$ .................................................. C30B 29/04
[52] U.S. Cl. ........................ 117/88; 117/14; 117/104; 117/105; 117/915; 117/929
[58] Field of Search ............................ 117/929, 915, 117/88, 101, 104, 105; 125/30.01

[56] References Cited

U.S. PATENT DOCUMENTS

| | | | |
|---|---|---|---|
| 5,114,745 | 5/1992 | Jones | 117/929 |
| 5,264,071 | 11/1993 | Anthony et al. | 117/929 |
| 5,273,731 | 12/1993 | Anthony et al. | 117/929 |
| 5,443,032 | 8/1995 | Vichr et al. | 117/929 |

FOREIGN PATENT DOCUMENTS 0206603 12/1986 European Pat. Off. ............ 117/929

*Primary Examiner*—Robert Kunemund
*Attorney, Agent, or Firm*—Volker R. Ulbrich

[57] ABSTRACT

Diamond film is deposited by chemical vapor deposition on the surface of a graphite mandrel which is covered with a protective coating to which the diamond film adheres. After completion of the deposition, the diamond is removed from the mandrel by sawing through the substrate to saw off a layer thereof which includes the deposition surface and the diamond film. The graphite and protective coating may be left in place for some applications or be removed either chemically or by mechanical abrasion to separate the diamond therefrom.

16 Claims, 4 Drawing Sheets

PRODUCTION OF DIAMOND FILM

FIELD OF THE INVENTION

This invention relates to synthesis of diamond and, more particularly, to an improved method for producing diamond film by chemical vapor deposition.

BACKGROUND OF THE INVENTION

Diamond has many extraordinary properties, including superlative hardness, thermal conductivity, and optical transmissivity. Synthetic diamond produced by chemical vapor deposition ("CVD") has become commercially viable for practical applications such as wear parts, heat sinks, and optical windows. However, while the cost of producing CVD diamond has decreased in recent years, it is still quite expensive.

The production of diamond film in a chemical vapor deposition process, such as a plasma jet CVD process, involves consideration of many practical, as well as technical, factors. In order to obtain the relatively high yield that is necessary for cost effectiveness, the process is carried out at high temperatures. The large heat fluxes at the deposition region during and after deposition cause stresses in the diamond that can result in cracking of the diamond film and/or lifting of the film from the deposition target medium before deposition is complete. The premature lifting is also called "delamination".

It has been recognized that a source of stress that can crack and/or prematurely delaminate a diamond film is a mismatch between the coefficients of thermal expansion of the diamond and the target medium upon which it is being deposited. To address this problem, deposition substrate materials having coefficients of thermal expansion relatively close to that of diamond can be selected. However, in selecting a substrate material, other properties must also be taken into consideration. For example, the material must be able to maintain its integrity in difficult environmental conditions of deposition, which include a high temperature and the presence of reactive substances, such as the atomic hydrogen that is essential for the CVD diamond deposition process. As an example, graphite is attractive as a substrate material because its coefficient of thermal expansion is generally close to that of diamond, and it has a relatively high thermal conductivity that helps promote temperature uniformity at the deposition surface. However, atomic hydrogen attacks graphite. One solution in the prior art has been to coat the graphite with a thin coating of a substance such as molybdenum or tungsten, or carbon-containing compounds such as silicon carbide, or fine powders of various other materials. Reference can also be made to copending U.S. patent application Ser. No. 08/618,428, which has an assignee in common with the assignee hereof, and which discloses a diamond deposition target medium comprising a graphite substrate and a coating on the substrate, the coating comprising diamond grit in a binder of a glass-forming oxide such as silicon dioxide. The described coatings can serve to protect the graphite from atomic hydrogen used in the diamond deposition process, and also to prevent delamination during deposition. Notwithstanding the adherence of diamond film to coatings on graphite, which generally reduces the probability of delamination during deposition, the stresses which arise during cool-down after deposition may overcome the adherence and conveniently result in the diamond film releasing intact from the deposition medium on which it was deposited. However, in many cases, the diamond may not release during cool-down, and subsequent efforts to achieve the release may result in cracking of the diamond film.

Techniques have been used and/or proposed for removing the diamond from the substrate (or coated substrate) by etching away or grinding away the substrate. However, these techniques have had drawbacks that include the expense of the removal procedure itself, the expense associated with destroying the substrate and rendering it unusable for subsequent diamond deposition, and/or the risk of damaging the diamond film.

It is among the objects of the present invention to provide an improved technique for removing intact diamond film while addressing the drawbacks of existing techniques.

SUMMARY OF THE INVENTION

In accordance with the invention, a method is set forth for producing diamond film, comprising the following steps: providing a graphite substrate having a surface over which diamond film is to be deposited; depositing diamond film over said surface of the substrate; and sawing through the substrate to saw off a layer thereof that includes the deposition surface and the diamond film.

In a disclosed embodiment of the invention, the deposition surface of the substrate is coated before depositing the diamond film, the diamond film being deposited on the coated deposition surface. In this embodiment, the step of sawing through the substrate comprises sawing with a wire saw. Preferably, the wire saw has a diameter in the range 0.001 to 0.05 inch, and the offset between the sawed surface of the layer and the diamond film is in the range 0.001 to 0.25 inch.

In a form of the invention, further diamond film is deposited on a surface of the substrate from which the layer has been sawed.

The technique of the present invention has significant advantages over prior art methods that attempt to etch away or grind away the substrate on which diamond film is deposited. One advantage is that it will be generally easier and cheaper to cut through the substrate when a graphite substrate is used. Also, for applications such as certain heat sinking or wear part applications, where it is not significantly disadvantageous to leave a thin layer of graphite attached to the diamond film, it may not be necessary to remove any graphite that remains attached to the diamond after sawing through the graphite substrate. If it is desired to remove the thin layer of graphite that remains after sawing, this can be done, for example, by grinding. A further advantage is that the graphite substrate, from which a thin top layer has been sawed away, can be reused, for example by re-finishing the sawed surface for deposition, or by using the opposing surface for deposition.

Further features and advantages of the invention will become more readily apparent from the following detailed description when taken in conjunction with the accompanying drawings.

DETAILED DESCRIPTION

Figure 1:
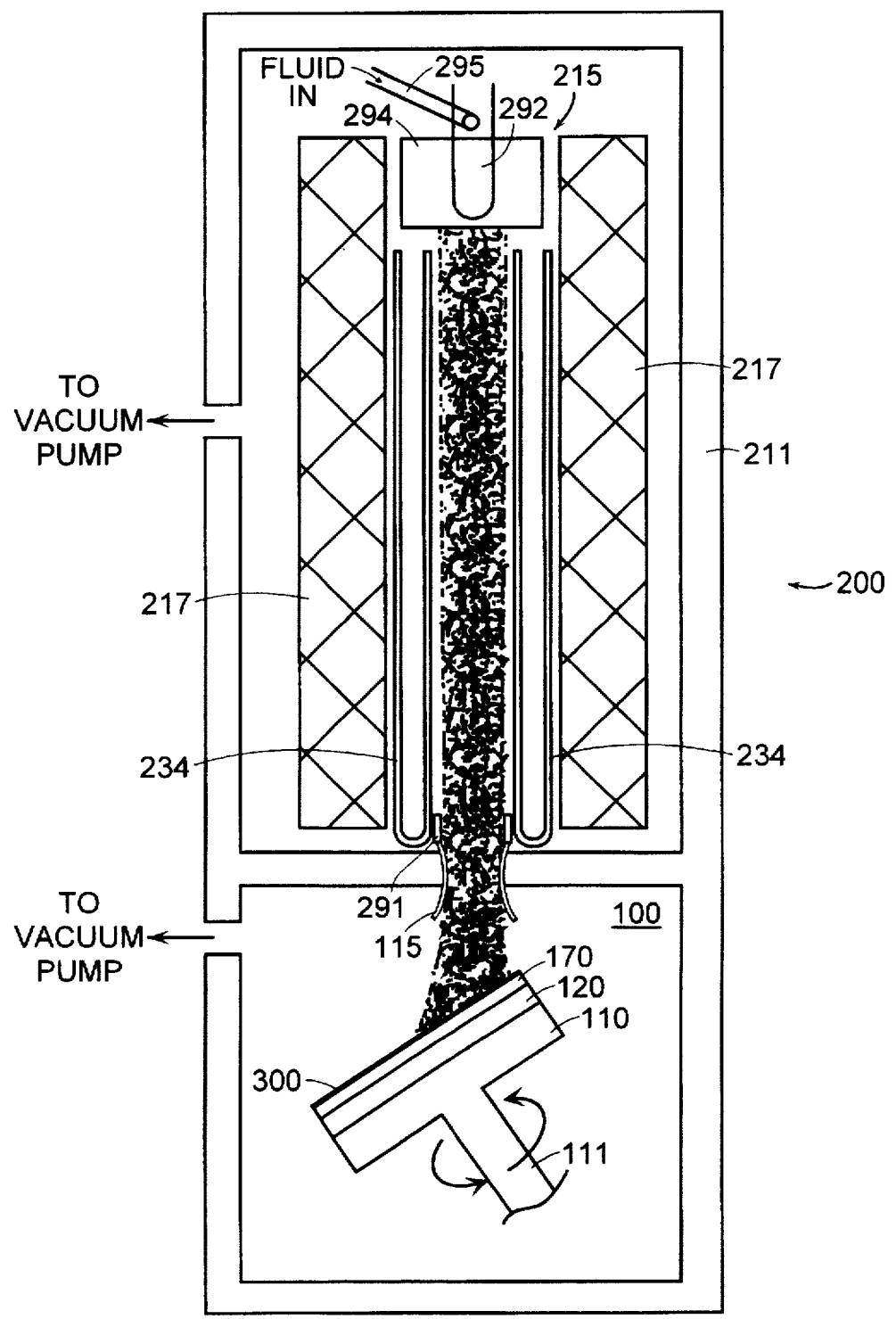
FIG. 1 is a diagram of a chemical vapor deposition apparatus of a type which can be utilized in practicing embodiments of the invention.

Referring to FIG. 1, there is shown a chemical vapor deposition ("CVD") apparatus of a type which can be utilized in practicing embodiments of the invention. [Examples of other types of CVD equipment that can be used are combustion flame, microwave, or hot filament equipment.] A deposition chamber 100 is the lower section of a plasma jet CVD deposition system 200, evacuated by one or more vacuum pumping systems (not shown).

The system 200 is contained within a vacuum housing 211 and includes an arc-forming section 215 which comprises a cylindrical holder 294, a rod-like cathode 292, and an injector 295 mounted adjacent to the cathode so as to permit injected fluid to pass over the cathode. A cylindrical anode is provided at 291. In the illustrated system, where synthetic diamond is to be deposited, the input fluid may be, for example, a mixture of hydrogen and methane. The methane could alternatively be fed in downstream. The anode 291 and cathode 292 are energized by a source of electrical power (not shown), for example a DC potential. Cylindrical magnets, designated by reference numeral 217, are utilized to help control the plasma generation. A nozzle, represented at 115, can be used to control beam size, within limitations. Optional cooling coils 234, in which a coolant can be circulated, can be located within the magnets.

In an example of operation, a mixture of hydrogen and methane is fed into the injector 295, and a plasma is obtained in front of the arc forming section and accelerated and focused toward the deposition region at which a substrate is located. As is known in the art, synthetic polycrystalline diamond can be formed from the described plasma, as the carbon in the methane is selectively deposited as diamond, and the graphite which forms is dissipated by combination with the atomic hydrogen that is obtained from dissociation of the hydrogen gas. For further description of plasma jet deposition systems, reference can be made to U.S. Pat. Nos. 4,471,003, 4,487,162, 5,204,144, 5,342,660, 5,435,849, and 5,487,787.

A mandrel 110 is rotatable on a shaft 111, and can have a spacer 120 and a substrate 170 mounted thereon by means not shown, bolting or clamping being typical. The substrate coating is shown at 300. The mandrel 110 can be cooled by any suitable means, for example by using a heat exchange fluid (e.g. water) that is circulated through the mandrel. As illustrated, the mandrel can be tilted with respect to the direction of the plasma jet, as is disclosed in U.S. Pat. No. 5,342,660.

Figure 2A:
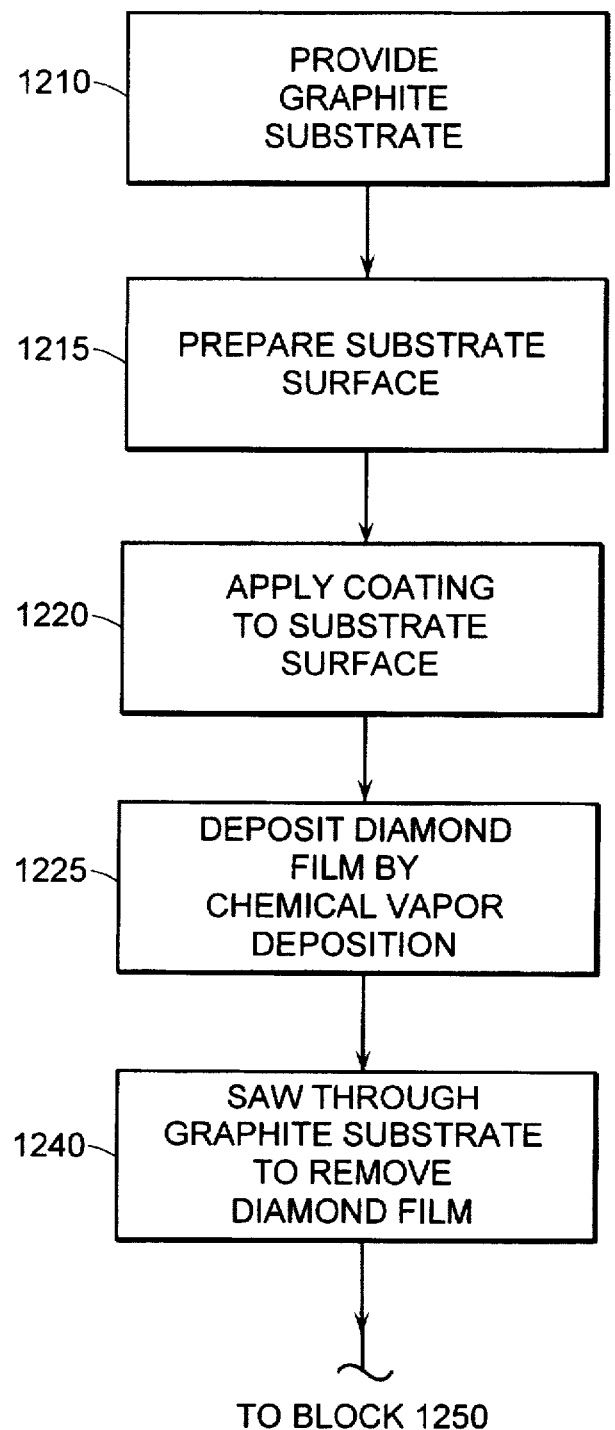
FIG. 2, which includes FIGS. 2A and 2B placed one below another, is a flow diagram summarizing steps of a method in accordance with an embodiment of the invention.
Figure 2B:
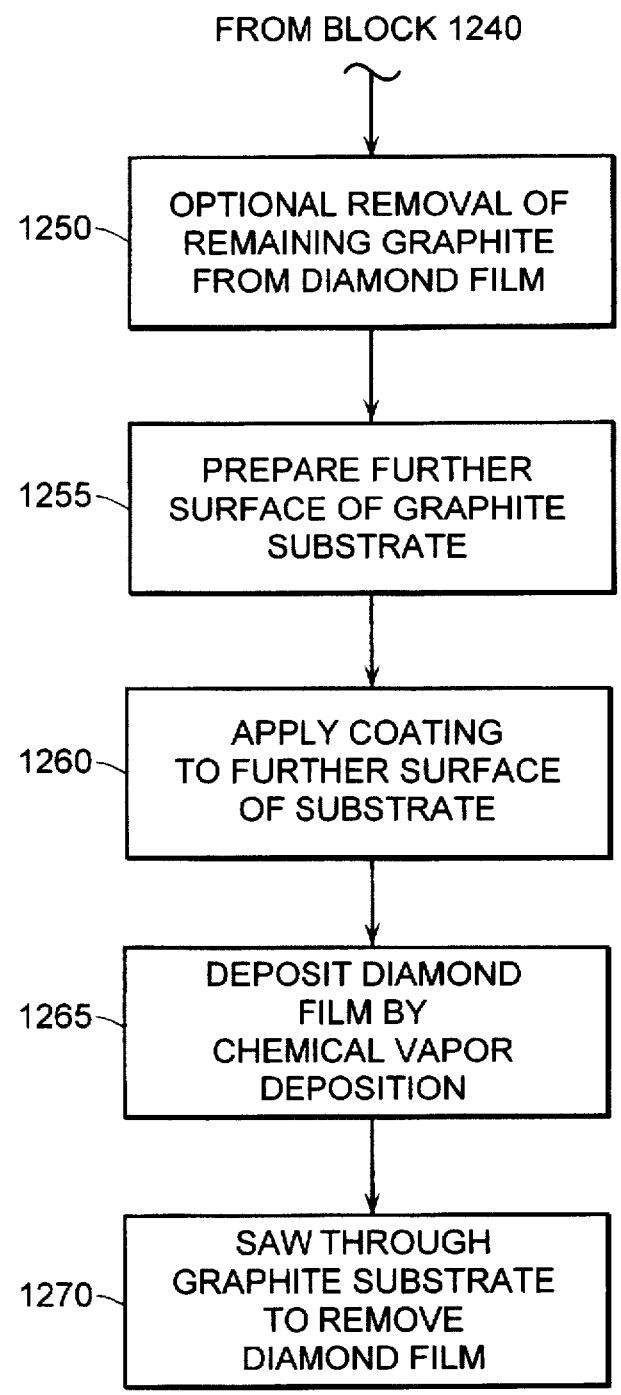

Referring to FIG. 2, there is shown a flow diagram summarizing steps of a method in accordance with an embodiment of the invention. The block 1210 represents providing of a graphite substrate. The graphite material can preferably have a relatively small pore size, for example a maximum pore size less than about 20 microns. Also, the graphite chosen can preferably have a coefficient of thermal expansion which substantially matches synthetic diamond. The graphite substrate can be machined or otherwise formed into a desired shape. This will generally be a flat disc, although it will be understood that other shapes and some other contours, for example a cylindrical contour, could be used. The block 1215 represents preparing of the substrate surface. Polishing can be implemented, for example, by lapping, and the surface should preferably be polished smoother than the pore size. The polished substrate surface can then be cleaned using an ultrasonic cleaner. The graphite thickness should preferably be at least 10 percent of the square root of its area, to promote thermal conductance and reduce radial thermal gradients that can contribute to premature delamination or cracking.

The block 1220 represents the applying of a coating to the prepared graphite surface. The coating may be any suitable material, for example those first mentioned in the background portion hereof. A preferred coating, as described in the above-referenced U.S. patent application Ser. No. 08/618,428, comprises diamond grit in a binder of a glass-forming oxide such as silicon dioxide. Reference can be made to said copending U.S. Patent Application for details of a preferred technique for applying the coating. The coating preferably has a thickness in the range 10 microns to 200 microns, and more preferably in the range 20 microns to 100 microns, but it will be understood that any suitable coating thickness can be used.

The block 1225 represents deposition of a diamond film on the coated substrate, preferably by chemical vapor deposition. Equipment of the type illustrated in FIG. 1 can be utilized. The diamond film can be deposited to any suitable thickness, but will generally be at least 100 microns thick. After deposition and cooling, in cases where the diamond film has not released from the substrate, the substrate and the diamond film thereon are removed from the deposition chamber for the removal technique hereof.

The block 1240 represents sawing through the graphite substrate to remove the diamond film from the bulk of the graphite substrate. Since the cut is offset by a small margin from the diamond film, a thin layer of graphite will generally remain attached to the diamond film.

As first noted above, depending on the intended application, it may be possible to utilize the diamond film with the layer of graphite still in place thereon. If, however, it is necessary or desirable to remove the graphite that remains on the diamond film, the block 1250 represents the (optional) removal of the graphite such as by grinding and/or etching. Suitable etches for removal of the remaining graphite, as well as the coating that served as an interlayer, are oxidizer based acids. It will be understood that other techniques could be used for removing the graphite layer that remains attached to the diamond film.

The remaining graphite substrate can, if desired, be prepared for re-use as a coated deposition substrate as represented by the blocks 1255 and 1260, which represent steps similar to corresponding blocks 1215 and 1220 above. For example, the sawed surface can be machined and/or otherwise prepared and then coated in the manner first described above. It will be understood that the surface of the graphite opposing the saw cut could alternatively be prepared and coated. Then, as represented by the blocks 1265 and 1270, diamond film can be deposited on the re-used coated graphite substrate, and the diamond film removed, as before.

Figure 3:
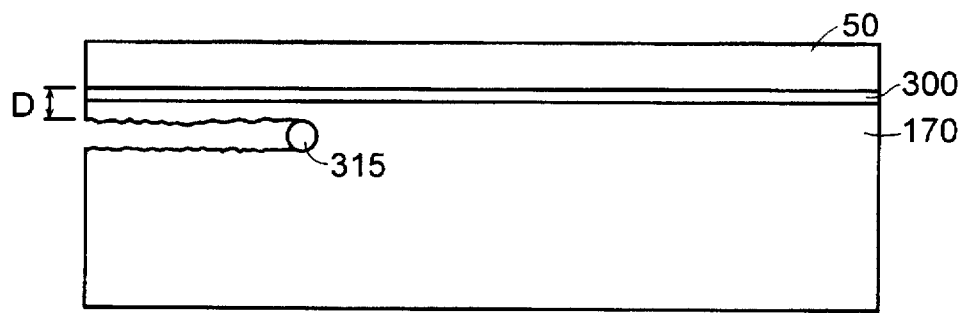
FIG. 3 illustrates an example of a saw cut through the graphite substrate as implemented in an embodiment of the invention.

FIG. 3 illustrates the substrate 170, coating 300, and diamond film 50, which can be mounted in a holder (not shown), and a saw 315 cutting through the graphite substrate, generally parallel to and slightly offset from the diamond film 50. One suitable holder is a rigid base with a vacuum applied through apertures in its thickness. In one embodiment, the saw is a wire saw comprising a reciprocating steel wire impregnated with diamond grit, and having a diameter of 0.015 inch. The preferred range of the wire saw diameter is 0.001 to 0.05 inch. Alternative sawing techniques can use a band saw or a cylindrical slitter (disc) saw, wherein the blade thickness is preferably also in the range 0.001 to 0.05 inch. The sawing can also be performed with a high velocity water or abrasive jet or with a laser.

The offset, D, between the top of the saw cut and the bottom of the diamond film is preferably in the range 0.001 to 0.25 inch, the objective being to avoid cutting too close to the diamond (and risking breakage) while minimizing the graphite that remains attached to the diamond film. It will be understood that the saw can cut away part of the coating, depending on its thickness.

The invention has been described with reference to a particular preferred embodiment, but variations within the spirit and scope of the invention will occur to those skilled in the art. For example, it will be understood that various alternate techniques of substrate preparation and coating can be used, and other saw configurations can be employed.

I claim:

1. A method for producing diamond film, comprising the steps of:

providing a graphite substrate having a surface over which diamond film is to be deposited;

depositing diamond film over said surface of said substrate; and sawing through said substrate to saw off a layer thereof that includes said deposition surface and said diamond film.

2. The method as defined by claim 1, further comprising the step of coating the deposition surface of said substrate before depositing said diamond film, said diamond film being deposited on said coated deposition surface.

3. The method as defined by claim 1, wherein said step of sawing through said substrate comprises sawing with a wire saw.

4. The method as defined by claim 1, wherein said step of sawing through said substrate comprises sawing with a wire saw.

5. The method as defined by claim 1, wherein said step of sawing through said substrate comprises sawing with a saw blade.

6. The method as defined by claim 2, wherein said step of sawing through said substrate comprises sawing with a saw blade.

7. The method as defined by claim 3, where said wire saw has a diameter in the range 0.001 to 0.05 inch.

8. The method as defined by claim 5, wherein the thickness of said was blade is in the range 0.001 to 0.05 inch.

9. The method as defined by claim 1, wherein said sawing step comprises sawing approximately parallel to said deposition surface.

10. The method as defined by claim 2, wherein said sawing step comprises sawing approximately parallel to said deposition surface.

11. The method as defined by claim 1, wherein the offset between the sawed surface of said layer and said diamond film is in the range 0.001 to 0.25 inch.

12. The method as defined by claim 9, wherein the offset between the sawed surface of said layer and said diamond film is in the range 0.001 to 0.25 inch.

13. The method as defined by claim 1, further comprising the step of depositing further diamond film on a surface of the substrate from which said layer has been sawed.

14. The method as defined by claim 2, further comprising the step of depositing further diamond film on a surface of the substrate from which said layer has been sawed.

15. The method as defined by claim 13, further comprising the step of sawing through said substrate to saw off a further layer that includes said further diamond film.

16. The method as defined by claim 14, further comprising the step of sawing through said substrate to saw off a further layer that includes said further diamond film.

* * * * *